US012393344B2

(12) United States Patent
Smith (10) Patent No.: US 12,393,344 B2
(45) Date of Patent: Aug. 19, 2025

(54) APPARATUSES AND METHODS FOR DIE REPLACEMENT IN STACKED MEMORY

(71) Applicant: MICRON TECHNOLOGY, INC., Boise, ID (US)

(72) Inventor: Scott Eugene Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 590 days.

(21) Appl. No.: 17/210,885

(22) Filed: Mar. 24, 2021

(65) Prior Publication Data

US 2021/0311638 A1     Oct. 7, 2021

Related U.S. Application Data

(60) Provisional application No. 63/006,180, filed on Apr. 7, 2020.

(51) Int. Cl.
| | | |
|---|---|---|
| *G06F 11/00* | (2006.01) | |
| *G06F 3/06* | (2006.01) | |
| *G11C 29/00* | (2006.01) | |
| *G11C 29/12* | (2006.01) | |

(52) U.S. Cl.
CPC .......... *G06F 3/0614* (2013.01); *G06F 3/0653* (2013.01); *G11C 29/12* (2013.01); *G11C 29/787* (2013.01)

(58) Field of Classification Search
CPC ...... G06F 11/2094; G06F 11/14; G06F 11/20; G06F 11/2028; G06F 11/2069
See application file for complete search history.

(56) References Cited

U.S. PATENT DOCUMENTS

| | | | |
|---|---|---|---|
| 8,193,006 B2 | 6/2012 | Chou et al. | |
| 9,389,997 B2* | 7/2016 | Winn | G06F 12/023 |
| 9,875,814 B2 | 1/2018 | Jeddeloh et al. | |
| 10,282,264 B1* | 5/2019 | Ogasawara | G11C 5/06 |
| 10,282,645 B2* | 5/2019 | Yamamoto | H04N 1/3871 |
| 11,151,006 B2* | 10/2021 | Niu | G06F 3/0688 |
| 2008/0157853 A1* | 7/2008 | Al-Shamma | H02M 3/073 |
| | | | 327/536 |
| 2008/0158936 A1* | 7/2008 | Bertin | G11C 13/025 |
| | | | 257/E21.666 |

(Continued)

FOREIGN PATENT DOCUMENTS

WO     2008157084 A1     12/2008

OTHER PUBLICATIONS

ISR/WO dated Jul. 19, 2021 for PCT Appl. No. PCT/US2021/024682.

(Continued)

*Primary Examiner* — Amine Riad
(74) *Attorney, Agent, or Firm* — Dorsey & Whitney LLP (57) ABSTRACT

Apparatuses and methods for repairing a memory are disclosed. In some examples, the memory may be a stacked memory that includes multiple die and at least one spare die. In some examples, a die may determine it is defective and provide signals causing the defective die to be disabled and a spare die to be enabled. In some examples, a component external to the memory, such as a memory controller, may determine a die is defective and provide signals causing the defective die to be disabled and a spare die to be enabled. In some examples, die may be enabled or disabled by fuses/antifuses.

30 Claims, 7 Drawing Sheets

(56) References Cited

U.S. PATENT DOCUMENTS

| | | | |
|---|---|---|---|
| 2008/0159042 A1* | 7/2008 | Bertin | H10B 99/00 257/E21.666 |
| 2010/0002512 A1 | 1/2010 | Cornwell et al. | |
| 2012/0215958 A1* | 8/2012 | Fai | G11C 8/10 710/316 |
| 2013/0033935 A1* | 2/2013 | Tu | G11C 29/832 365/185.18 |
| 2014/0233292 A1 | 8/2014 | Kang et al. | |
| 2017/0125119 A1 | 5/2017 | Loh et al. | |
| 2017/0255390 A1* | 9/2017 | Chang | G06F 3/0659 |
| 2019/0035748 A1 | 1/2019 | Afzali-Ardakani et al. | |
| 2020/0090708 A1 | 3/2020 | Yamada et al. | |
| 2021/0006582 A1* | 1/2021 | Yamada | H04L 63/102 |
| 2021/0311638 A1* | 10/2021 | Smith | G11C 29/12 |

OTHER PUBLICATIONS

PCT Patent Application PCT/US21/24682 titled "Apparatuses and Methods for Die Replacement in Stacked Memory" filed Mar. 29, 2021.

\* cited by examiner

APPARATUSES AND METHODS FOR DIE REPLACEMENT IN STACKED MEMORY

CROSS REFERENCE TO RELATED APPLICATION(S)

This application claims priority to U.S. Provisional Application No. 63/006,180 filed Apr. 7, 2020. The aforementioned application is incorporated herein by reference, in its entirety, for any purpose.

BACKGROUND

In recent years, three-dimensional (3D) memory devices have been introduced. Some 3D memory devices are formed by stacking die vertically and coupling the die using through-silicon (or through-substrate) vias (TSVs) and/or wire bonds. Thus, 3D memory may also be referred to as "stacked memory." 3D memory may provide greater memory capacity and/or higher bandwidth with less increase in area than non-3D memory. Example 3D memory devices include Hybrid Memory Cube (HMC), High Bandwidth Memory (HBM), and Master-Slave Memory (MSM).

MSM may include multiple dynamic random access memory (DRAM) die coupled to one another in a stack. One die may serve as a master die and the remaining die may serve as slave die. The master die may control memory operations of the slave die. In some MSM, the master die and slave die may be identical with either a hardwired or programmable designation as to which die serves as the master die. In other MSM, the master die may have a different design than the slave die. The master die may be the only die of the MSM to directly interface with a component external to the memory (e.g., a substrate, a memory controller). Having only one die directly coupled to a component external to the MSM in a device including the MSM (e.g., a memory module including multiple MSMs, a computing device) may reduce loading on the device.

DETAILED DESCRIPTION

According to embodiments of the present disclosure, a memory may be a stacked memory that includes multiple die and at least one spare die. The spare die may allow the memory to continue to operate at the same capacity after a die of the stack becomes defective. In some embodiments, a die may determine it is defective, for example, by running a self-test, and provide signals causing the defective die to be disabled and a spare die to be enabled. In some embodiments, a component external to the memory, such as a memory controller, may determine a die is defective and provide signals (e.g., commands and/or layer identification information) causing the defective die to be disabled and the spare die to be enabled. In some embodiments, a die may be enabled or disabled by fuses and/or antifuses. In some embodiments, connecting the spare die to the stack only when a die becomes defective may reduce loading on the memory device. In some embodiments, including a spare die in a stacked memory may reduce the need to replace an entire memory device and/or operate at a reduced memory capacity.

Figure 1:
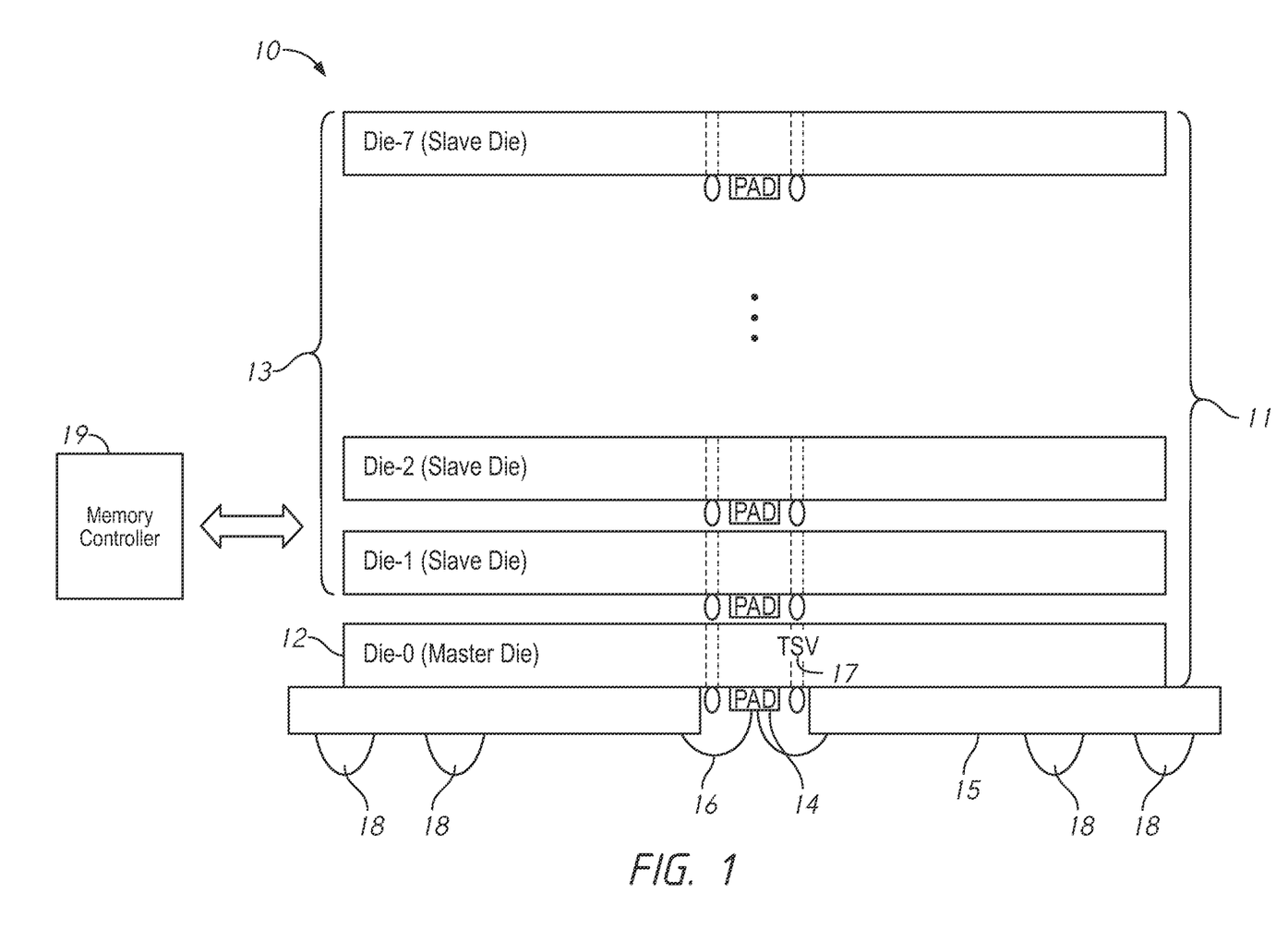
FIG. 1 is a schematic diagram of a memory device including a plurality of dies in accordance with an embodiment of the present disclosure.

FIG. 1 is a schematic diagram of a memory device 10 including multiple die 11 in accordance with an embodiment of the present disclosure. The memory device 10 may be a Master-Slave Memory (MSM) in some embodiments. In the embodiment shown in FIG. 1, memory device 10 includes eight die 11, however, memory device 10 may include two or more die. In some embodiments, the die 11 may be arranged in a stack that includes a master die 12 and one or more slave die 13. In some embodiments, the die 11I may be identical to one another with respect to circuit configurations. In some embodiments, the master die 12 may have a different circuit configuration (e.g., different layout, different circuit components, and/or additional circuit components) than the slave die 13. For example, the master die 12 may include additional circuitry for communicating with the slave die 13. In some applications when the master die 12 has a different circuit configuration than the slave die 13, it may be referred to as a logic die. In some embodiments, master die 12 may be designated as the master die and slave die 13 may be designated as slave die by hardwiring (e.g., fuse/antifuse programming) and/or programmed (e.g., writing to a register) on the die 11. The master die (Die-0) 12 may include one or more pads PAD 14 that are coupled to a package substrate 15 via one or more bonding wires 16. The one or more bonding wires 16 may be coupled to lands (e.g., pads) (not shown) of the package substrate 15. Bonding Pads (PAD) of each of the slave die 13 (Die-1 to Die-7) may be in a floating state, decoupled from the package substrate 15. The master die 11 may communicate with each of the slave die 13 (Die-1 to Die-7) by way of vias TSV 17 (e.g., through-substrate or through-silicon vias) and/or wire bonds (not shown). Bump electrodes 18 may be disposed on an outer surface of the package substrate 15. The bump electrodes 18 may be coupled to power lines or signal channels (not shown) of memory device 10 or of a device including memory device 10 (not shown).

In some embodiments, the master die 12 may communicate with a memory controller 19, for example, via pad 14, bond wires 16, and/or bump electrodes 18. In some embodiments, the memory controller 19 may be included in memory device 10, for example, coupled to package substrate 15. In other embodiments, the memory controller 19 may be external to memory device 10. The memory controller 19 may provide commands to the master die 12 to control memory operations of the master die 12 and/or slave die 13. The memory controller 19 may provide and receive data from memory arrays included in master die 12 and/or slave die 13.

Figure 2:
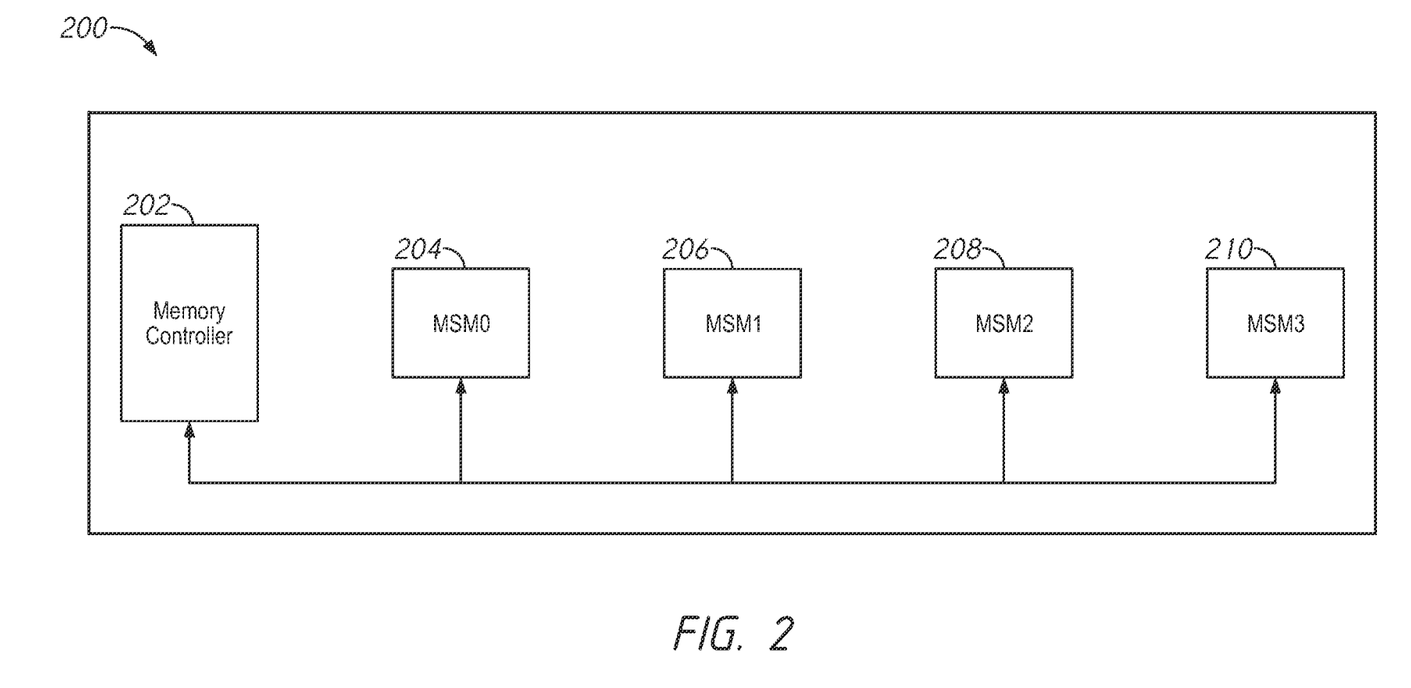
FIG. 2 is a memory module in accordance with an embodiment of the disclosure.

FIG. 2 is a memory module 200 in accordance with an embodiment of the disclosure. In some embodiments, memory module 200 may be a DIMM. In some embodiments, memory module 200 includes multiple memory devices 204-210. In some embodiments, the memory devices 204-210 may be master-slave memory devices (MSM0-3). In some embodiments, the memory devices 204-210 may each include memory device 10 of FIG. 1. The memory module 200 may facilitate installing the memory devices 204-210 in a computing device and/or coupling the memory devices 204-210 to a computing device (not shown).

In some embodiments, memory module 200 may further include a memory controller 202 in communication with the memory devices 204-210. In other embodiments, the memory controller 202 may be included in the computing device in which memory module 200 is included and/or to which the memory module 200 is coupled. The memory controller 202 may provide commands to the memory devices 204-210 to control memory operations. The memory controller 202 may provide and receive data from the memory devices 204-210. In some embodiments, the memory controller 202 may detect when one or more of the memory devices 204-210 are defective. In response, the memory controller 202 may stop communicating with the defective memory device. In some embodiments, one of the memory devices 204-210 may be a spare memory device. For example, memory device 210 may be a spare memory device. During normal operation of the module 200, the memory controller 202 may only communicate with memory devices 204-208. Memory devices 204-210 may each include multiple memory die (e.g., memory die 11). If one of the memory die of a memory device 204-210 becomes defective, the entire memory device 204-210 may become defective even if the remaining die are operable. If the memory controller 202 detects that one of memory devices 204-208 is defective, the memory controller 202 may stop communicating with the defective memory device and begin communicating with memory device 210. Thus, memory device 210 acts as a replacement memory device and the capacity of the memory module 200 is maintained. However, including an extra memory device on the memory module 200 may utilize additional layout area and/or incur additional cost.

According to embodiments of the present disclosure, a memory device may include one or more spare die. For example, if the memory device has four die (e.g., 4H stack), a fifth die may be included in the stack (e.g., 5H stack). In another example, if the memory device has eight die (e.g., 8H stack), a ninth die may be included in the stack (e.g., 9H stack). If the memory device and/or a memory controller detects a defective die in the stack, the defective die may be unused and/or disabled and the spare die may be used and/or enabled in the defective die's place. In some embodiments, including spare die in the memory devices of a memory module may allow greater granularity for repairs. For example, only a die rather than entire memory device can be replaced. In some applications, it may be more cost effective and/or utilize less layout area on a memory module to include extra die in memory devices rather than including an extra memory device.

Figure 3:
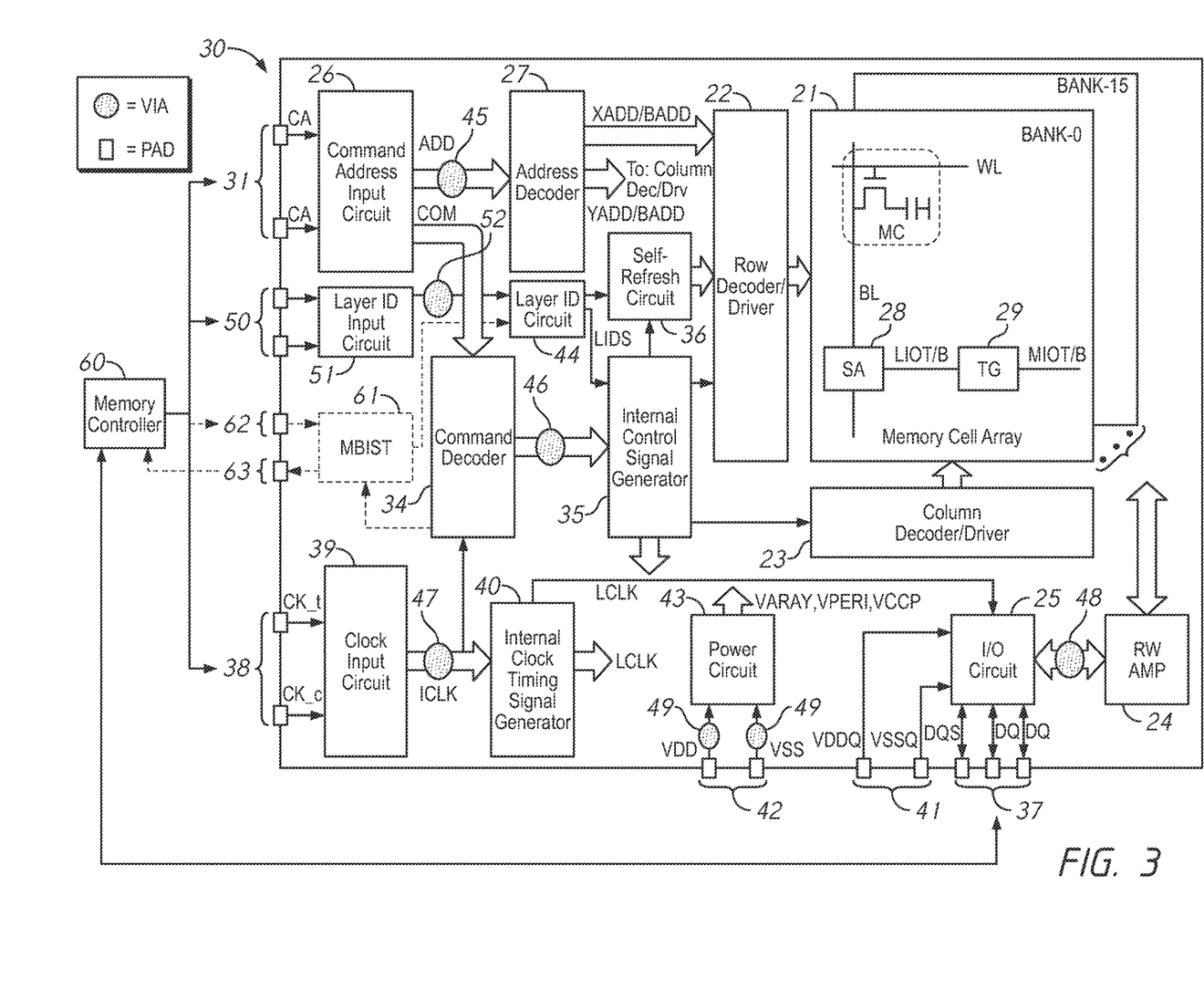
FIG. 3 is a block diagram of a memory die in accordance with an embodiment of the present disclosure.

FIG. 3 is a block diagram of a memory die 30 in accordance with an embodiment of the present disclosure. In some embodiments, the memory die 30 may be used to implement one or more of die 11 shown in FIG. 1. In some embodiments, memory die 30 may be a memory device. For example, the memory die 30 may be a volatile memory device, such as a dynamic random access memory, a static random access memory, or the like. The memory die 30 may be a non-volatile memory device, such as a NOR or NAND flash memory device. The memory die may also be other examples of memory devices, such as, magnetoresistive random access memory, ferroelectric memory, etc. As shown in FIG. 3, the memory die 30 may include a memory cell array 21. The memory cell array 21 includes a plurality of banks (e.g., BANK-0 to BANK-15), each bank including a plurality of memory cells MC arranged at intersections of a plurality of word lines WL and a plurality of bit lines BL. However, for clarity, only a single memory cell MC, word line WL, and bit line BL are shown in FIG. 3. A selection of the word line WL is performed by a row decoder/driver 22 and a selection of the bit line BL is performed by a column decoder/driver 23. Sense amplifiers SA 28 are coupled to corresponding bit lines BL and connected to local I/O line pairs LIOT/B. Local IO line pairs LIOT/B are connected to main IO line pairs MIOT/B via transfer gates TG 29 which are configured as switches.

Turning to the explanation of a plurality of external terminals (or pads) included in the memory die 20, the plurality of external terminals (or pads) may include command/address terminals 31, clock terminals 38, data terminals 37, power supply terminals 41 and 42, and layer ID terminals 50. In some embodiments, the plurality of external terminals may be included in pads 14 in FIG. 1. The command/address terminals 31 may receive command address signals CA. In some embodiments, the command address signals CA may be provided by a memory controller 60. In some embodiments, memory controller 60 may include memory controller 19 and/or memory controller 202. The command/address terminals 31 may provide the command address signals CA to a command address input circuit 26. The command address input circuit 26 may decode the command address signals CA to generate address signals ADD provided to an address decoder 27 in the master die (e.g., Die-0). The address decoder 27 of each slave die of the slave die (e.g., Die-1 to Die-7) may receive the address signals ADD through address via 45 from the master die (e.g., Die-0). The address decoder 27 may provide decoded row address signals XADD to the row decoder/driver 22, and decoded column address signals YADD to the column decoder/driver 23. The address decoder 27 may also provide bank address signals BADD to the row decoder/driver 22. While the command address terminals 31 and the command address input circuit 26 may be also included in each slave die of the slave die (e.g., Die-1 to Die-7), the address decoder 27 of each slave die of the slave dies (e.g., Die-1 to Die-7) may receive the address signals ADD through address via 45 from the master die (e.g., Die-0). That is, in some embodiments, the command address terminals 31 and/or command address input circuit 26 may be disabled and/or unused on slave die.

In master die (e.g., Die-0), the command address input circuit 26 may provide the command signals COM to a command decoder 34. The command signals COM may include one or more separate signals. The command signals COM received by the command address terminals 31 may be provided to the command decoder 34. The command decoder 34 may decode the command signals COM and provide the decoded command signals to an internal control signal generator 35. The decoded command signals may be provided to an internal control signal generator 35 of each slave die (e.g., Die-1 to Die-7) through command via 46. Thus, in some embodiments, the command decoder 34 of the slave die may be disabled and/or unused. The internal control signal generator 35 may generate various control signals. For example, the control signals may include a row command signal to select a word line and a column command signal, such as a read command or a write command, to select a bit line, and an auto refresh signal that may be provided to a self-refresh circuit 36.

When a row activation command is issued and a row address is timely supplied with the activation command, and a column address is timely supplied with a read command, read data is read from memory cell or cells MC in the memory cell array 21 designated by the row address and column address responsive to a data strobe signal received at a DQS pad of the data terminals 37. The read data DQ is provided as output signals at DQ pads of the data terminals 37 through a read/write amplifier (RW AMP) 24 and an input/output (I/O) circuit 25 and/or through data via 48 between the read/write amplifier 24 and the input/output circuit 25. Similarly, when the row activation command is issued and a row address are timely supplied with the activation command, and a column address is timely supplied with a write command, and then write data DQ is supplied to the DQ pads together with the data strobe signal at the DQS pad of the data terminals 37, the write data DQ is supplied via the input/output circuit 25 and the read/write amplifier 24 to the memory cell array 21 and written in the memory cells MC designated by the row address and the column address.

The data paths between the input/output circuit 25 and the read/write amplifier 24 in a master die (e.g., Die-0) may be coupled through the data via 48 to the data paths between the input/output circuit 25 and the read/write amplifier 24 in each slave die of slave dies (e.g., Die-1 to Die-7). Thus, the input/output circuit 25 of master die (e.g., Die-0) may receive read data from one or more slave die (e.g., Die-1 to Die-7) and write data to be written into one or more slave die (e.g., Die-1 to Die-7). In some embodiments, while the slave die may include I/O circuit 25 and data terminals 37, the I/O circuit 25 and/or one or more of the data terminals 37 may be disabled and/or unused. In some embodiments, the I/O circuit 25 may include switches, logic circuits and/or other control circuitry (not shown) that determines whether data from the master die and/or data from one or more of the slave die is provided to the DQ pads of the data terminals 37. In some embodiments, the I/O circuit 25 of the master die may provide data from the master die and one or more slave die on the DQ pads of the data terminals 37. For example, data terminals 37 may include DQ pads DQ0-7. The I/O circuit 25 may provide data from the master die on DQ pads DQ0-3 and data from a slave die on DQ pads DQ4-7. In some embodiments, the memory controller 60 may provide data to and/or receive data from the data terminals 37 of the master die.

The clock terminals 38 may receive external clock signals CK_t and CK_c of the master die (e.g., Die-0), respectively. These external clock signals CK_t and CK_c are complementary to each other and are supplied to a clock input circuit 39. The clock input circuit 39 may receive the external clock signals CK_t and CK_c and may generate an internal clock signal ICLK. The clock input circuit 39 may provide the internal clock signal ICLK an internal clock and timing signal generator 40 and thus a phase controlled internal clock signal LCLK may be generated based on the received internal clock signal ICLK. Although not limited thereto, a DLL circuit can be used as the internal clock and timing signal generator 40. The phase controlled internal clock signal LCLK is supplied to the input/output circuit 25 and may be used as a timing signal for determining an output timing of the read data DQ. The internal clock signal ICLK is also supplied to the command decoder 34 for decoding the command signal COM to generate various control signals. The internal clock signal ICLK from the clock input circuit 39 of the master die (e.g., Die-0) may be supplied through clock via 47 to an internal clock and timing signal generator 40 of the slave die (e.g., Die-1 to Die-7) to perform similar operations to the internal clock and timing signal generator 40 of the master die (e.g., Die-0). In some embodiments, the clock input circuit 39 may not be used and/or disabled on the slave die.

The power supply terminals 41 are supplied with power supply potentials VDDQ and VSSQ. These power supply potentials VDDQ and VSSQ are supplied to the input/output circuit 25. The power supply potentials VDDQ and VSSQ may be the same potentials as the power supply potentials VDD and VSS that are supplied to the power supply terminals 42, respectively. However, the dedicated power supply potentials VDDQ and VSSQ may be used for the input/output circuit 25 so that power supply noise generated by the input/output circuit 25 does not propagate to the other circuit blocks.

The power supply terminals 42 are supplied with power supply potentials VDD and VSS. These power supply potentials VDD and VSS are supplied to a power circuit 43. The internal power circuit 43 may generate various internal potentials VARAY, VPERI, VCCP and the like based on the power supply potentials VDD and VSS. The internal potential VCCP may be a voltage higher than the power supply potential VDD generated by a charge pumping circuit (not shown) and may be mainly used in the row decoder/driver 22. The internal potential VARAY may be mainly used in the sense amplifiers 28 included in the memory cell array 21, and the internal potential VPERI may be used in many other circuit blocks. The power supply potentials VDD and VSS supplied to the power supply terminals 42 of the master die (e.g., Die-0) may be provided to a power circuit 43 of each slave die (e.g., Die-1 to Die-7) through power TSV 49 in order to generate internal potentials for each slave die.

The memory die 30 may include pads and vias. As mentioned earlier, the pads may include the command and address terminals 31, the data terminals 37, the clock terminals 38, and power terminals 41 and 42. For example, the vias may be through silicon vias and the vias may include the address via 45, the command via 46, the clock via 47, the data via 48, the power via 49, and layer via 52. As mentioned earlier, the memory die 30 may be one of the plurality of die 11 in FIG. 1 and the pads of the plurality of die 11 and the vias of the plurality of die 11 may be vertically aligned with one another. The vias of the plurality of die 11 may be coupled to one another. Thus, various signals such command signals, address signals, data signals for receiving and transmitting from and/or to an external apparatus may be shared across the plurality of dies through the vias. In other embodiments, one or more of the vias may be replaced by wire bonds. In some embodiments, the die and/or wire bonds may not be vertically aligned (e.g., the wire need not be straight).

In some embodiments, the memory die 30 may include a layer identifier (ID) circuit 44. The layer ID circuit 44 may set layer ID information unique to each memory die 30 of a stack including the memory die 30 (e.g., plurality of die 11) in a start-up (e.g., initializing) sequence. The memory die 30 may further include a set of layer ID terminals 50 that may receive layer ID information to designate a memory die to be accessed in access operations, designate a status of the memory die 30 (e.g., enabled or disabled), and/or designate how the memory die operates (e.g., as master, slave, or spare). In some embodiments, the layer ID information may be provided by the memory controller 60. When the layer ID information at the terminals 50 is supplied to the input circuit 51, the input circuit 51 may provide the layer ID information to the layer ID circuit 44 of the master die (e.g., Die-0) and may simultaneously provide the layer ID information to the layer ID circuit 44 of each slave die of the slave dies (e.g., Die-1 to Die-7) through the layer via 52. In some embodiments, the layer ID information may indicate which die in a stack of die is the master die, which die are slave die, and which die, if any, is a spare die. However, in some embodiments, the master/slave/spare assignments and/or other layer ID information may be hardcoded (e.g., wired, fuse/antifuse programming) in the memory die 30 rather than provided each time in a start-up sequence.

The layer ID circuit 44 may activate the memory die 30 in response to the layer ID information and/or the command signals received at the command terminals 31, if the layer ID information is indicative of the memory die 30, for example, by providing layer ID signals LIDS. The layer ID circuit 44 may activate the internal control signal generator 35 and/or other circuits in some embodiments, for example, by providing layer ID signals LIDS. In some embodiments, the layer ID circuit 44 may enable or disable the memory die 30 or components thereof in response to the layer ID information and/or the command address signals received at the command terminals 31. For example, the layer ID circuit 44 may disable the I/O circuit 25 and/or command decoder 34 of slave die by providing commands included in LIDS to the internal control signal generator 35. In some embodiments, the layer ID circuit 44 may enable or disable the memory die 30 and/or components of the memory die 30 by programming fuses and/or antifuses.

According to embodiments of the present disclosure, memory die 30 may be included in a stack that includes multiple die (e.g., plurality of die 11), of which one or more may be a spare die. In some embodiments, to reduce load on a memory device that includes the multiple die, the spare die may not be fully coupled to the stack. The stack may include one or more fuses and/or antifuses that may be programmed to couple or decouple individual memory die 30 from the stack. In some embodiments, the fuses and/or antifuses may be included in and/or controlled by the layer ID circuit 44. For example, when memory die 30 is determined to be defective, as will be described in more detail, the layer ID circuit 44 may program fuses to disconnect the memory die 30 or components of the memory die 30 from the stack in some embodiments. In another example, when memory die 30 is a spare die and another die becomes defective, the layer ID circuit 44 may program antifuses to couple memory die 30 to the stack. Although fuses are described as used to disconnect die and/or components and antifuses are described as used to couple die and/or components, in some embodiments, either fuses or antifuses may be used to couple or decouple die and/or components. Furthermore, in some embodiments, other techniques may be used for coupling and/or decoupling, for example, switches (e.g., solid state switches).

The memory controller 60 may provide and/or receive signals from the memory die 30 directly and/or indirectly. For example, the memory controller 60 may directly provide and/or receive signals from memory die 30 if memory die 30 is designated as a master die. For example, memory controller 60 may receive data from DQ terminals 37. When memory die 30 is designated as a slave die, in some embodiments, the memory controller 60 may provide and/or receive signals from memory die 30 indirectly (e.g., through a master die). However, in some embodiments, even when memory die 30 is designated as a slave die, the memory controller 60 may provide and/or receive one or more signals directly.

In some embodiments, the memory controller 60 may determine when memory die 30 is not operating properly (e.g., defective). The memory controller 60 may use any variety of techniques to determine whether or not the memory die is operating properly. For example, the memory controller 60 may detect when data was not received (or incomplete data was received) responsive to a read command. In another example, the memory controller 60 may determine that memory die 30 is not operating properly when the memory controller 60 receives an error signal from a processor (not shown) responsive to receiving invalid data from the memory die 30 through the memory controller 60. In a further example, the memory controller 60 may periodically provide commands for testing the operation of the memory die 30 and the memory die 30 may provide an output responsive to the commands that the memory controller 60 analyzes to determine whether or not the memory die 30 is operating properly.

In some embodiments, when the memory controller 60 determines that the memory die 30 is not operating properly, the memory controller 60 may provide commands to the command address terminals 31 and/or layer ID information to the terminals 50 that may cause memory die 30 to become disabled. In some embodiments, when memory die 30 is a spare die, if memory controller 60 has determined another die (not shown) in a stack including memory die 30 is not operating properly, the memory controller 60 may provide commands to the command address terminals 31 and/or layer ID information to terminals 50 to cause memory die 30 to become enabled (e.g., the layer ID circuit 44 may program antifuses to couple the memory die 30 to the stack). The memory controller 60 may then access the spare die for memory operations (e.g., write, read) in place of the defective die. The memory controller 60 may provide signals to the spare die and no longer provide signals to the defective die. In some embodiments, the memory controller 60 may further provide layer ID information such that data from the defective die is rerouted to the enabled spare die. In some embodiments, some or all of the layer ID information provided to the spare die may be the same as the layer ID information of the defective die.

Optionally, in some embodiments, the memory die 30 may include a memory built-in self-test (MBIST) circuit 61. The MBIST circuit 61 may perform self-tests on the memory cell array 21 and/or other memory components of the memory die 30 to determine if the memory die 30 is operating properly. The MBIST circuit 61 may perform self-tests automatically, responsive to a command provided to the command address input circuit 26, and/or a test signal provided to a test input terminal 62. In some embodiments, the test signal may be provided by the memory controller 60. After the self-test, the MBIST circuit 61 may provide a result signal indicating whether the test indicated the memory die 30 was operating properly or not.

In some embodiments, the result signal may be provided to a result terminal 63. In some embodiments, the result signal may be received by the memory controller 60 from the result terminal 63. Responsive to a result signal that indicates the memory die 30 is not operating properly, the memory controller 60 may provide control signals that cause the layer ID circuit 44 to disable the memory die 30 (e.g., programming fuses to disconnect the memory die 30 from the stack). In some embodiments, the memory controller 60 may provide control signals to a spare memory die in a stack (not shown) including memory die 30 that may cause the spare memory die to be enabled. Thus, memory die 30 may be disabled and replaced by the spare memory die. The spare memory die may then be used (e.g., operated) for memory operations and the disabled die may no longer be used.

In some embodiments, the result signal may be provided to the layer ID circuit 44. Responsive to a result signal that indicates the memory die 30 is not operating properly, the layer ID circuit 44 may disable the memory die 30. In some embodiments, the MBIST circuit 61 and/or the layer ID circuit 44 may provide a signal (e.g., through layer via 52 or command via 46) to a spare die in a stack (not shown) including memory die 30 that cause the spare die to be enabled. That is, in some embodiments, the stack may repair itself without input from the memory controller 60.

Figure 4:
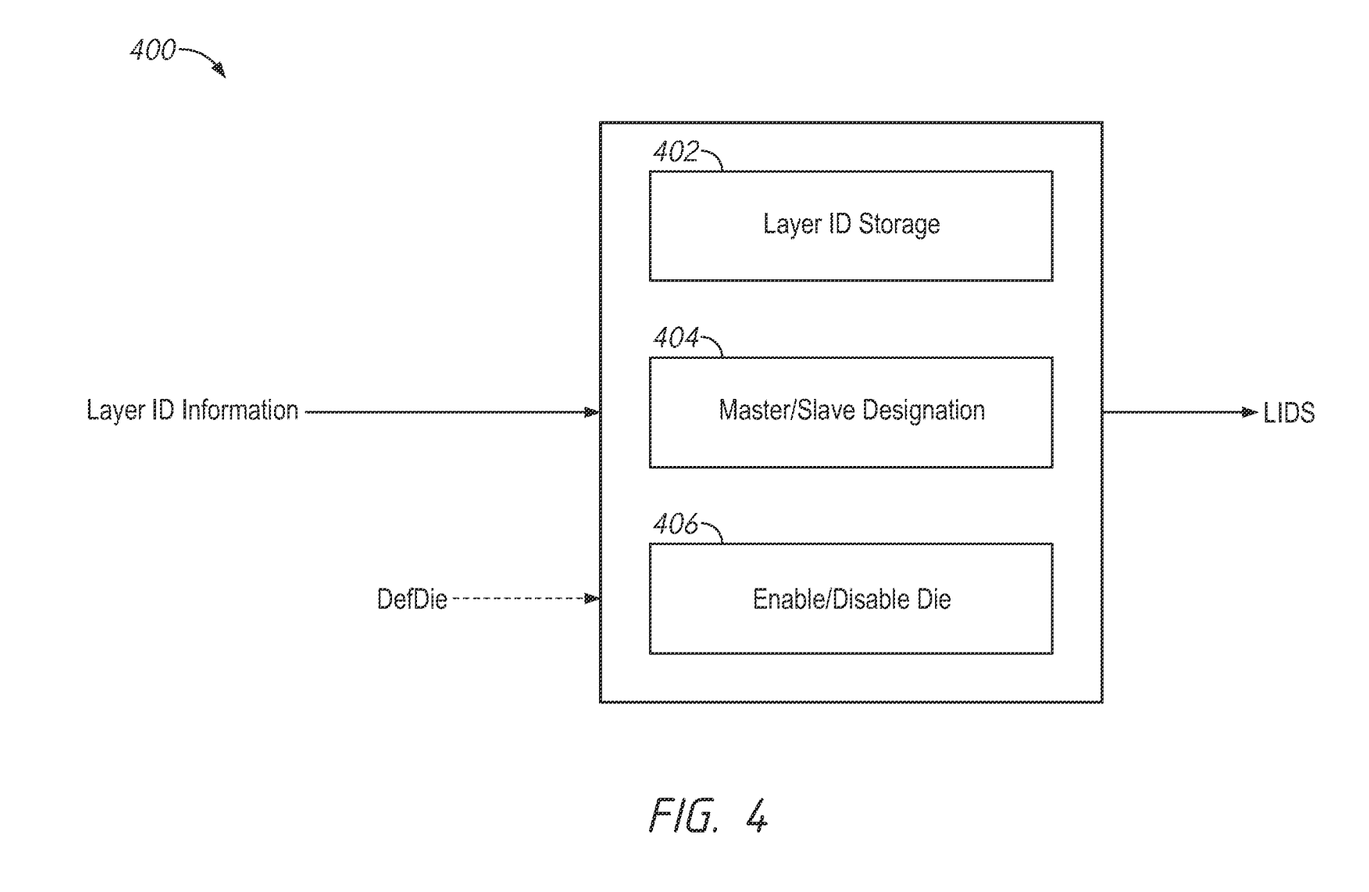
FIG. 4 is a block diagram of a layer ID circuit in accordance with an embodiment of the present disclosure.

FIG. 4 is a block diagram of a layer ID circuit 400 in accordance with an embodiment of the present disclosure. In some embodiments, layer ID circuit 400 may be included in a memory die, such as memory die 11 and/or memory die 30. In some embodiments, layer ID circuit 400 may be included in layer ID circuit 44 shown in FIG. 3. The layer ID circuit 400 may receive layer ID information at an input. In some embodiments, the layer ID information may be provided by a memory controller, such as memory controller 60. In some embodiments, the layer ID information may be provided via a layer ID input circuit, such as layer ID input circuit 51. If the layer ID circuit 400 is included in a memory die designated as a master die, the layer ID information may be provided via layer ID terminals, such as layer ID terminals 50 in some embodiments. If the layer ID circuit 400 is included in a memory die designated as a slave die, the layer ID information may be provided via a layer via, such as layer via 52. Optionally, in embodiments where the memory die includes an MBIST circuit, such as MBIST circuit 61, the layer ID circuit 400 may receive a defective die signal DefDie from the MBIST, which may indicate whether or not the memory die is defective. The layer ID circuit 400 may provide layer ID signals LIDS through an output. The layer ID signals LIDS may include information based, at least in part, on the layer ID information received. Examples of LIDS include, but are not limited to, a unique identifier for the memory die, enable signals for one or more components in the memory die. LIDS may be a multi-channel signal in some embodiments.

In some embodiments, the layer ID circuit 400 may include a layer ID storage 402. The layer ID storage 402 may store information relating to a unique identifier for the memory die in the received layer ID information. This unique identifier may allow the memory die to be enabled and/or accessed separately from other memory die. In some embodiments, the layer ID storage 402 may include a register, such as a multipurpose register. However, other storage may be used. In some embodiments, the unique identifier stored in the layer ID storage 402 may be compared to an identifier provided with a command. If the identifier of the command matches the unique identifier stored in the layer ID storage 402, the memory die may execute the command. If the command and identifier do not match the unique identifier, the memory die may ignore the command. In some embodiments, the layer ID circuit 400 may include a comparator circuit (not shown) that compares the identifier in the layer ID storage 402 to an identifier included with a command. In other embodiments, the layer ID circuit 400 may provide the identifier to another component of the memory die that performs the comparison (e.g., the command decoder 34, the internal control signal generator 35).

In some embodiments, the layer ID circuit 400 may include a master/slave designation (MSD) circuit 404. The MSD circuit 404 may store information relating to whether the memory die is set to operate as a master die, a slave die, or a spare die received in the layer ID information. In some embodiments, the MSD circuit 404 may include a register, such as a multipurpose register. However, other storage may be used. In some embodiments, the MSD circuit 400 may be configured to provide an LIDS that enables or disables various components on the memory die to allow the memory die to operate as a master or slave die. For example, in some embodiments, if the MSD circuit 404 receives a '0' for the master/slave designation, the MSD circuit 404 may provide a low LIDS signal that disables various components of the memory die such as a command decoder and an I/O circuit in order to configure the memory die as a slave die.

In some embodiments, the layer ID circuit 400 may include an enable/disable die (EDD) circuit 406. In some embodiments, the EDD circuit 406 may include control logic that causes fuses and/or antifuses to be programmed based on the layer ID information and/or DefDie. For example, where the memory die is a spare die, if the layer ID information indicates that the spare needs to be brought into operation to replace a defective die, the EDD circuit 406 may program the appropriate antifuses to couple the die to the stack and/or enable the memory die (e.g., activate a charge pump to provide a voltage to program the antifuses). In another example, where the memory die is a master or slave die, if the layer ID information and/or the DefDie indicates that the memory die is defective, the EDD circuit 406 may program the appropriate fuses to decouple the die from the stack and/or disable the memory die (e.g., activate the charge pump to provide a voltage to program the fuses). In some embodiments, the EDD circuit 406 may include the charge pump and/or fuses/antifuses. In some embodiments, the EDD circuit 406 may provide commands through the LIDS to enable the charge pump and program the appropriate fuses and/or antifuses. In some embodiments, the charge pump may be shared by a post package repair (PPR) circuit included in the memory die.

Figure 5:
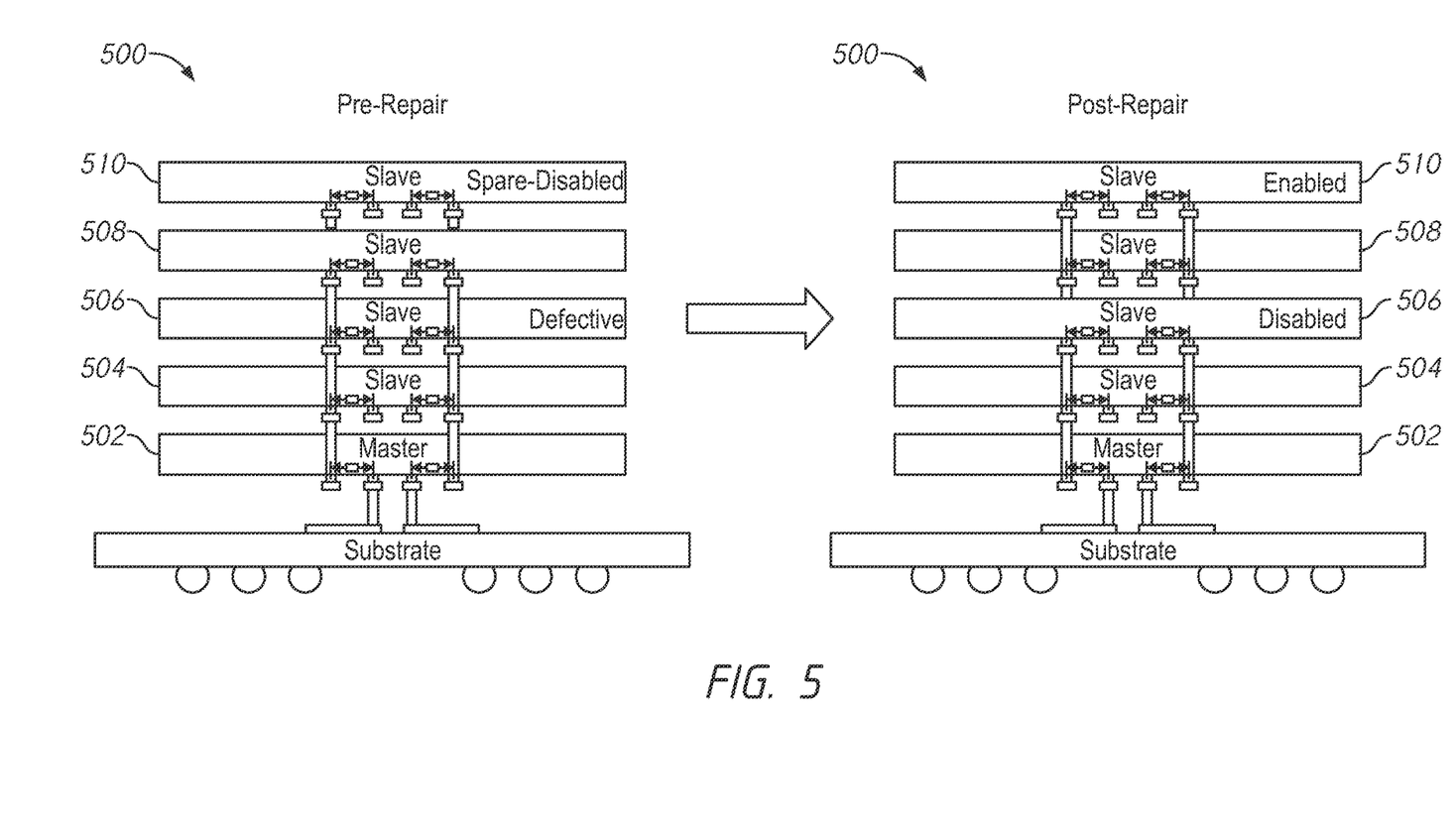
FIG. 5 is a schematic illustration of a memory device before and after repair in accordance with an embodiment of the present disclosure.

FIG. 5 is a schematic illustration of a memory device 500 before and after repair in accordance with an embodiment of the present disclosure. In some embodiments, memory device 500 may be included in memory device 10, and/or memory device 204, 206, 208, and/or 210. The memory device 500 includes a master die 502, three slave die 504, 506, and 508, and a spare die 510. In some embodiments, master die 502, slave die 504-508, and spare die 510 may include memory die 30.

In the example shown on the left-hand side of FIG. 5, the slave die 510 is disabled. Slave die 506 is defective. In some embodiments, slave die 506 may have been determined to be defective by a memory controller (not shown in FIG. 5), such as memory controller 19, memory controller 202 and/or memory controller 60. The memory controller may provide commands and/or layer ID information to the memory device 500 that may cause the layer ID circuit (e.g., layer ID circuit 44 and/or layer ID circuit 400) of the slave die 506 to disable the slave die 506 as shown on the right-hand side of FIG. 5. The memory controller may provide commands and/or layer ID information to the memory device 500 that may cause the layer ID circuit of the spare die 510 to enable the spare die 510 as shown on the right-hand side of FIG. 5. The layer ID information may include the appropriate layer ID and slave designation such that the spare die 510 acts as a slave die that responds to commands and/or other signals previously directed to the slave die 506. Although slave die 506 is shown as an example in FIG. 5, the spare die 510 may be used to replace any of the slave die 504, 506, or 508.

In some embodiments, one or more components on slave die 506, such as a MBIST circuit (e.g., MBIST circuit 61), may have determined the slave die 506 was defective. For example, if a defective die signal (e.g., DefDie) is active, the signal may cause the layer ID circuit included in slave die 506 to disable slave die 506. In some embodiments, the DefDie signal may be provided to a memory controller that may provide commands to activate the spare die 510 to replace slave die 506. In other embodiments, the layer ID circuit of slave die 506 may provide layer ID signals (e.g., LIDS) to the spare die 510 through a via or other die interconnect (e.g., layer via 52 and/or command via 46). The layer ID signals provided by the defective slave die 506 to the spare die 510 may cause the layer ID circuit of the spare die 510 to enable the spare die 510 to replace the slave die 506.

In some embodiments, the master die 502 may be hard wired to communicate with a memory controller and/or other components (not shown) outside the memory device 500 and the spare die 510 may not include any wiring or antifuses that allow the spare die 510 to be coupled to the master die 502 and the conductive lines that are coupled to the components outside the memory device 500. In these embodiments, the spare die 510 may be used to replace a defective memory array on the master die 502 (e.g., the memory addresses of the master die 502 may be remapped to the spare die 510). But if another component of the master die 502, such as the IO circuit, becomes defective, the spare die 510 may not be able to replace the master die 502. However, in other embodiments, the spare die 510 may include antifuses, switches, or other mechanisms that may allow the spare die 510 to couple to conductive lines that transmit and receive information from outside components. In these embodiments, the spare die 510 may fully replace the master die 502 as well as any slave die 504, 506, or 508.

Figure 6:
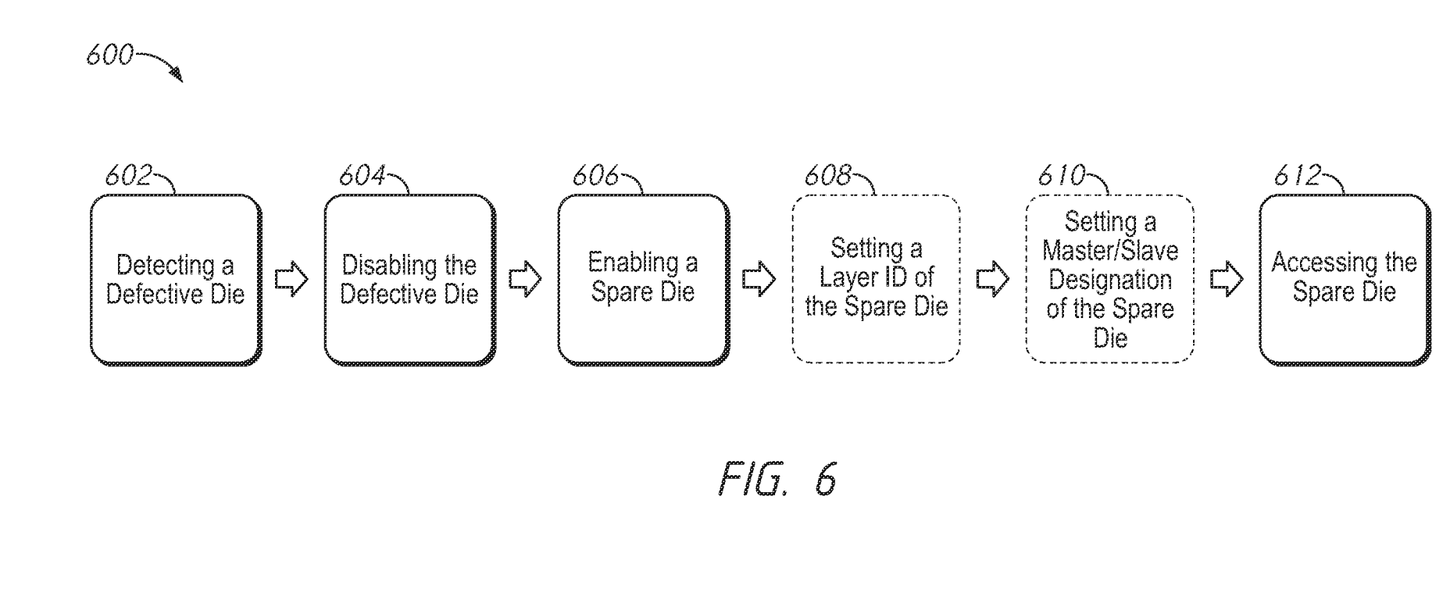
FIG. 6 is a flow chart of a method in accordance with an embodiment of the present disclosure.

FIG. 6 is a flow chart of a method 600 in accordance with an embodiment of the present disclosure. In some embodiments, some or all of the method 600 may be performed by a memory controller, such as memory controller 19, memory controller 202, and/or memory controller 60.

At block 602, "detecting a defective die," may be performed. In some embodiments, the memory controller may detect the defective die by running one or more tests on a memory die. In some embodiments, the memory controller may detect the defective die by determining that data provided from the memory die did not match expected data or was invalid. In some embodiments, the memory controller may detect the defective die based on a signal received from a MBIST circuit included with the memory die.

At block 604, "disabling the defective die" may be performed. In some embodiments, the memory controller may disable the defective die by providing commands and/or layer ID information to the defective die, for example, via command address terminals (e.g., command address terminals 31) and/or layer ID terminals (e.g., layer ID terminals 50). At block 606, "enabling a spare die" may be performed. In some embodiments, the memory controller may enable the spare die by providing commands and/or layer ID information to the spare die. In some embodiments, block 606 may be performed before block 604. In some embodiments, blocks 604 and 606 may be performed simultaneously.

At block 612, "accessing the spare die" may be performed. The spare die may be accessed for a memory operation directed to the disabled die in place of (e.g., instead of) the disabled die. For example, an access command including an identifier for the disabled die may be executed by the spare die. Thus, the spare die may replace the disabled die. In some embodiments, the memory controller may access the spare die for the memory operation, such as a read operation or a write operation.

Optionally, at block 608, "setting a layer ID of the spare die" may be performed. In some embodiments, the memory controller may set the layer ID of the spare die by providing layer ID information to the spare die. Also optionally, at block 610, "setting a master/slave designation of the spare die" may be performed. In some embodiments, the memory controller may set the master/slave designation of the spare die by providing layer ID information to the spare die. In some embodiments, block 610 may be performed before block 608. In some embodiments, blocks 608 and 610 may be performed simultaneously. In some embodiments, blocks 606, 608, and 610 may be performed simultaneously. In some embodiments, blocks 608 and 610 may be performed before block 612. In other embodiments, disabling the defective die and enabling the spare die is sufficient to allow the spare die to be accessed in place of the defective die or another technique may be used to allow the spare die to be accessed in place of the defective die (e.g., the memory controller may alter the commands and/or addresses provided to the memory device).

Figure 7:
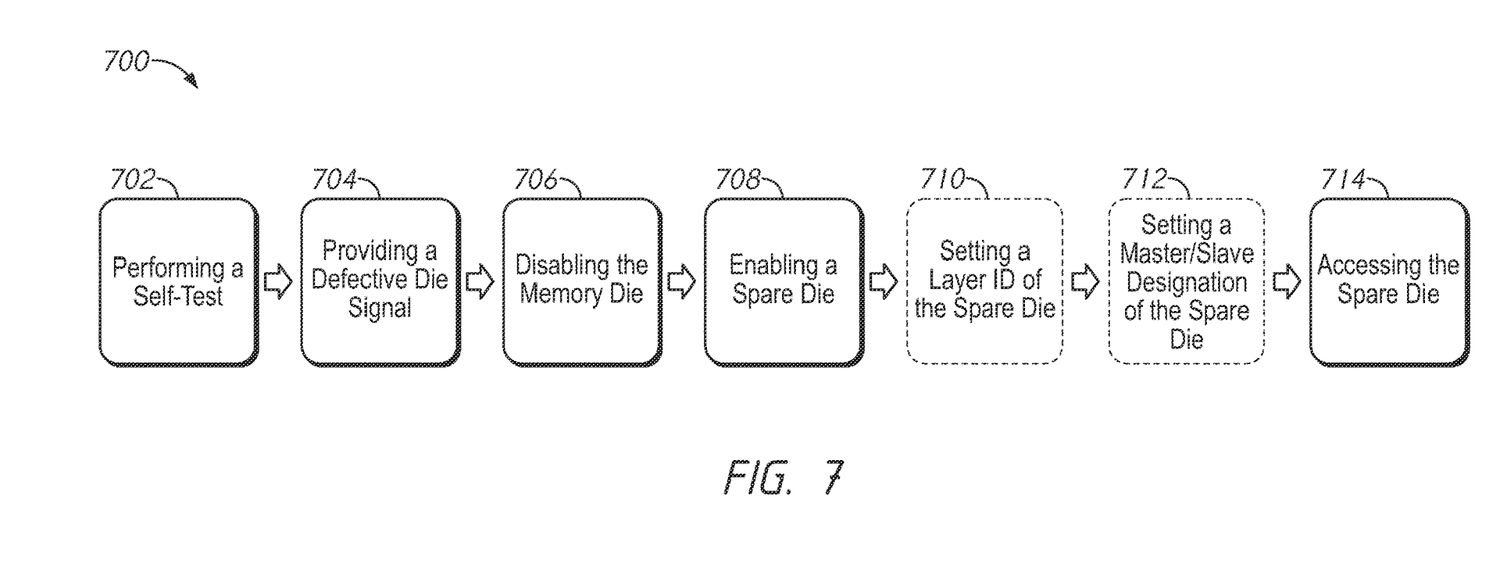
FIG. 7 is a flow chart of a method in accordance with an embodiment of the present disclosure.

FIG. 7 is a flow chart of a method 700 in accordance with an embodiment of the present disclosure. In some embodiments, some or all of the method 700 may be performed by one or more memory die included in a memory device, such as memory device 10, memory device 204, 206, 208, and/or 210, and/or memory device 500. In some embodiments, some of the method 700 may be performed by a memory controller, such as memory controller 19, memory controller 202, and/or memory controller 60.

At block 702, "performing a self-test" may be performed. In some embodiments, the self-test may be performed by a MBIST circuit included with a memory die, such as MBIST circuit 61. The self-test may return a result that indicates whether or not the memory die is defective. If the result indicates that the memory die is normal (e.g., not defective), in some embodiments, block 702 may be repeated at regular intervals and/or responsive to a test command (e.g., from a command decoder and/or a memory controller). If the result indicates that the memory die is defective, "providing a defective die signal" may be performed at block 704. In some embodiments, the MBIST may provide the defective die signal. In some embodiments, the defective die signal may be provided to an output terminal, such as result terminal 63. In some embodiments, the defective die signal may be provided to a layer ID circuit, such as layer ID circuit 44 and/or layer ID circuit 400, included with the memory die.

At block 706, "disabling the memory die" may be performed. In some embodiments, disabling the memory die may be performed by the layer ID circuit, for example, by programming fuses and/or providing disable signals to one or more components of the memory die. At block 708, "enabling a spare die" may be performed. In some embodiments, enabling the spare die may be performed by the layer ID circuit by providing a layer ID signal to the spare die through a via, such as layer via 52, command via 46, and/or other die interconnect (e.g., wire bond). At block 714, "operating the spare die" may be performed. The spare die may operate in place of (e.g., instead of) the defective die. For example, the spare die may respond to commands received from a memory controller directed to the disabled die whereas the disabled die no longer responds to the commands. Thus, the spare die may replace the defective die.

Optionally, at block 710, "setting a layer ID of the spare die" may be performed. Also optionally, at block 712, "setting a master/slave designation of the spare die" may be performed. Blocks 710 and 712 may be performed by the layer ID circuit by providing layer ID information to the spare die through a layer via, such as layer via 52. In some embodiments, blocks 706, 708, 710, 712 may be performed simultaneously. In some embodiments, block 710 and/or block 712 may be performed prior to block 706 and/or block 708. In some embodiments, block 712 may be performed before block 710. In some embodiments, block 708 and/or block 706 may be performed prior to blocks 710 and 712 and blocks 710 and 712 may then be performed simultaneously. In some embodiments, blocks 710 and 712 may be performed before block 714. In other embodiments, disabling the defective die and enabling the spare die is sufficient to allow the spare die to operate in place of the defective die or another technique may be used to cause the spare die to be operated in place of the defective die.

Alternatively, in some embodiments, one or more of blocks 706-714 may be performed by a memory controller. For example, responsive to receiving the defective die signal at block 704, the memory controller may provide the layer ID information to the spare die to perform blocks 710 and 712. In these embodiments, operating the spare die at block 714 may include accessing the spare die for a memory operation.

Memory devices according to embodiments of the present disclosure may include one or more spare die. If the memory device and/or a memory controller detects a defective die in the stack, the defective die may be unused and/or disabled and the spare die may be used and/or enabled in the defective die's place. In some embodiments, including spare die in the memory devices of a memory module may allow greater granularity for repairs. For example, only a die rather than entire memory device can be replaced. In some applications, it may be more cost effective and/or utilize less layout area on a memory module to include extra die in memory devices rather than including an extra memory device.

The description of certain embodiments herein is merely exemplary in nature and is in no way intended to limit the scope of the disclosure or its applications or uses. In the detailed description of the present apparatuses, systems and methods, reference is made to the accompanying drawings which form a part hereof, and which are shown by way of illustration specific embodiments in which the described apparatuses, systems and methods may be practiced. These embodiments are described in sufficient detail to enable those skilled in the art to practice presently disclosed apparatuses, systems and methods, and it is to be understood that other embodiments may be utilized and that structural and logical changes may be made without departing from the spirit and scope of the disclosure. Moreover, for the purpose of clarity, detailed descriptions of certain features are not discussed when they would be apparent to those with skill in the art so as not to obscure the description of embodiments of the disclosure. The detailed description is therefore not to be taken in a limiting sense, and the scope of the disclosure is defined only by the appended claims.

Of course, it is to be appreciated that any one of the examples, embodiments or processes described herein may be combined with one or more other examples, embodiments and/or processes or be separated and/or performed amongst separate devices or device portions in accordance with the present systems, devices and methods. Finally, the above-discussion is intended to be merely illustrative and should not be construed as limiting the appended claims to any particular embodiment or group of embodiments. Thus, while various embodiments of the disclosure have been described in particular detail, it should also be appreciated that numerous modifications and alternative embodiments may be devised by those having ordinary skill in the art without departing from the broader and intended spirit and scope of the present disclosure as set forth in the claims that follow. Accordingly, the specification and drawings are to be regarded in an illustrative manner and are not intended to limit the scope of the appended claims.

What is claimed is:

1. An apparatus comprising:
  a memory die electrically decoupled from and electrically couplable to at least one of a logic die or one or more other memory dies, the memory die comprising an enable/disable die circuit configured to electrically couple the memory die, responsive to a signal received via the at least one of the logic die or the one or more other memory dies, indicating the memory die is to be electrically coupled to the at least one of the logic die or the one or more other memory dies,
    wherein the enable/disable die circuit is configured to electrically couple the memory die to the at least one of the logic die or the one or more other memory dies by programming one or more antifuses.

2. The apparatus of claim 1, wherein the signal indicating the memory die is to be electrically coupled to the at least one of the logic die or the one or more other memory dies comprises:
  a signal indicating a second memory die is is defective;
  layer identifier information; or
  one or more commands.

3. The apparatus of claim 2, wherein the signal indicating the second memory die is defective includes layer identifier information provided by a second layer identifier circuit included with the second memory die.

4. The apparatus of claim 2, wherein the second memory die further comprises a memory built-in self-test circuit, wherein the memory built-in self-test circuit is configured to provide the signal indicating the second memory die is defective.

5. The apparatus of claim 4, wherein the memory built-in self-test circuit is configured to perform a self-test on the second memory die and provides the signal indicating the second memory die is defective responsive to a result of the self-test that indicates that the second memory die is defective.

6. The apparatus of claim 2, wherein the at least one logic die or the one or more other memory dies and the first memory die operate together at a same capacity when the first memory die is electrically coupled and the second memory die is electrically decoupled as a capacity the at least one logic die or the one or more other memory dies and the second memory die operate at together when the first memory die is electrically decoupled and the second memory die is electrically coupled.

7. The apparatus of claim 1, wherein the enable/disable die circuit is further configured to electrically decouple the memory die responsive to a signal indicating the memory die is defective, the enable/disable die circuit configured to program one or more fuses to electrically decouple the memory die.

8. The apparatus of claim 1, wherein the enable/disable die circuit is included in a layer identifier circuit, and the layer identifier circuit further comprises:
a layer identifier storage; and
a master/slave designation circuit.

9. The apparatus of claim 1, wherein:
the memory die is a first memory die;
the enable/disable die circuit is a first enable/disable die circuit; and
the apparatus further comprises a second memory die electrically coupled to and electrically decouplable from the at least one of the logic die or the one or more other memory dies, the second memory die comprising a second enable/disable die circuit configured to electrically decouple the second memory die by programming one or more fuses.

10. The apparatus of claim 9, wherein:
the layer identifier circuit is a first layer identifier circuit;
a layer identifier storage is a first layer identifier storage;
the master/slave designation circuit is a first master/slave designation circuit; and
the second enable/disable die circuit is included in a second layer identifier circuit, and the second layer identifier circuit further comprises:
a second layer identifier storage; and
a second master/slave designation circuit.

11. The apparatus of claim 9, wherein:
the signal indicating the first memory die is to be electrically coupled to the at least one of the logic die or the one or more other memory dies comprises layer identifier information; and
the layer identifier information includes a layer identifier and a slave designation such that the first memory die acts as the second memory die and responds to commands or other signals previously directed to the second memory die.

12. An apparatus comprising:
a master die;
a slave die electrically coupled to the master die; and
a spare die electrically decoupled from the master die and electrically couplable to the master die,
wherein each of the master die, the slave die, and the spare die include an enable/disable die circuit, wherein the enable/disable die circuit included with the slave die is configured to electrically decouple the slave die from the master die by programming one or more fuses or one or more switches responsive to a signal and the enable/disable die circuit included with the spare die is configured to electrically couple the spare die to the master die by programming one or more antifuses or one or more switches responsive to the signal,
wherein the spare die is accessed for a memory operation directed to the slave die responsive to the signal, and
wherein each of the master die and the slave die further include a master/slave designation circuit, wherein the master/slave designation circuit is configured to disable one or more components of the slave die when the slave die is designated as the slave die.

13. The apparatus of claim 12, wherein:
the signal is a first signal; and
the enable/disable die circuit included with the master die is configured to electrically decouple the master die by programming one or more fuses or one or more switches responsive to a second signal and further configured to electrically couple the spare die responsive to the second signal.

14. The apparatus of claim 12, wherein the enable/disable die circuit included with the master die is configured to disable a memory army of the master die responsive to a signal indicating the master die is defective and further configured to enable the spare die responsive to the signal indicating the master die is defective.

15. The apparatus of claim 12, wherein the signal comprises:
a signal indicating the slave die is defective;
a command; or
layer identifier information.

16. The apparatus of claim 12, wherein:
the signal comprises a signal indicating the slave die is defective; and
the slave die includes a memory built-in self-test circuit configured to perform a self-test and provide the signal indicating the slave die is defective when a result of the self-test indicates the slave die is defective.

17. The apparatus of claim 12, wherein the enable/disable die circuit included with the spare die includes a charge pump configured to blow the one or more antifuses.

18. The apparatus of claim 12, wherein the master die and the slave die are coupled by through-silicon vias.

19. A method comprising:
detecting a defective memory die of a stack of memory die, wherein the stack of memory die and the defective memory die operate together at a memory capacity;
electrically disabling the defective memory die from the stack of memory die by programming one or more fuses; and
electrically enabling a spare die of the stack of memory die to the stack of memory die by programming one or more antifuses,
wherein the spare die is accessed for a memory operation directed to the defective memory die responsive to electrically disabling the defective memory die and electrically enabling the spare die and wherein the stack of memory die and the spare die operate together at a same memory capacity when the spare die is electrically enabled and the defective memory die is electrically disabled.

20. The method of claim 19, wherein detecting the defective memory die includes performing a test on an individual memory die of the stack of memory die.

21. The method of claim 19, wherein detecting the defective memory die includes determining data provided by the defective memory die is invalid or missing.

22. The method of claim 19, wherein the method is performed by a memory controller coupled to the stack of memory die.

23. The method of claim 19, further comprising:
setting a layer identifier of the spare die; and
setting a master/slave designation of the spare die.

24. The method of claim 19, further comprising electrically disabling one or more components on the spare die.

25. A method comprising:
performing a self-test on a memory die of a stack of memory die to generate a result;
providing a defective die signal based on the result indicating the memory die is defective;
electrically decoupling, by programming one or more fuses or one or more switches, the memory die from the stack of memory die responsive to the defective die signal; and
electrically coupling, by programming one or more antifuses or switches, a spare die of the stack of memory die to the stack of memory die, wherein the stack of memory die operates together with the spare die at a same capacity with the spare die electrically coupled as the stack of memory die operates together with the memory die electrically coupled.

26. The method of claim 25, wherein the self-test is performed by a memory built-in self-test circuit included with the memory die.

27. The method of claim 25, wherein electrically decoupling the memory die is performed by a layer identifier circuit included with the memory die.

28. The method of claim 27, wherein electrically coupling the spare die is performed by a layer identifier circuit included with the spare die.

29. The method of claim 25, wherein the spare die is electrically coupled responsive to a signal provided by one of the memory die or a memory controller.

30. The method of claim 25, further comprising:
setting a layer identifier of the spare die; and
setting a master/slave designation of the spare die.

* * * * *

UNITED STATES PATENT AND TRADEMARK OFFICE
CERTIFICATE OF CORRECTION

| | | |
|---|---|---|
| PATENT NO. | : 12,393,344 B2 | Page 1 of 1 |
| APPLICATION NO. | : 17/210885 | |
| DATED | : August 19, 2025 | |
| INVENTOR(S) | : Scott Eugene Smith | |

It is certified that error appears in the above-identified patent and that said Letters Patent is hereby corrected as shown below:

In the Claims

| | Reads | Should Read |
|---|---|---|
| Column 15, Line 19, Claim 10 | "a first laver identifier circuit" | --a first layer identifier circuit-- |
| Column 16, Line 3, Claim 14 | "disable a memory army of the master die" | --disable a memory array of the master die-- |
| Column 16, Line 31, Claim 19 | "electically enabling a spare die" | --electrically enabling a spare die-- |

Signed and Sealed this
Sixth Day of January, 2026

John A. Squires
*Director of the United States Patent and Trademark Office*